(12) United States Patent
Orsillo

(10) Patent No.: US 6,839,948 B2
(45) Date of Patent: Jan. 11, 2005

(54) TOOLING PLATE ADAPTED TO FACILITATE RAPID AND PRECISE ATTACHMENT INTO A PROBING STATION

(76) Inventor: James Orsillo, P.O. Box 68991, Portland, OR (US) 97268

( * ) Notice: Subject to any disclaimer, the term of this patent is extended or adjusted under 35 U.S.C. 154(b) by 73 days.

(21) Appl. No.: 10/101,686

(22) Filed: Mar. 18, 2002

(65) Prior Publication Data
US 2003/0164717 A1 Sep. 4, 2003

Related U.S. Application Data

(62) Division of application No. 09/662,735, filed on Sep. 15, 2000, now Pat. No. 6,408,500.

(51) Int. Cl.[7] .................................................. B23Q 3/00
(52) U.S. Cl. .................. 29/281.6; 29/407.09; 29/407.1; 29/525.01; 29/559; 269/287; 269/288; 324/758
(58) Field of Search .......................... 29/401.1, 402.01, 29/402.04, 402.06, 402.08, 402.09, 402.14, 402.15, 428, 525.01, 525.11, 559, 281.6, 407.09, 407.1; 269/287, 288; 324/754, 758

(56) References Cited

U.S. PATENT DOCUMENTS

| 5,220,279 A | 6/1993 | Nagasawa |
| 5,264,787 A | 11/1993 | Woith et al. |
| 5,355,079 A * | 10/1994 | Evans et al. ................. 324/754 |
| 5,410,259 A | 4/1995 | Fujihara et al. |
| 5,528,158 A | 6/1996 | Sinsheimer et al. ........ 324/758 |
| 5,647,178 A * | 7/1997 | Cline ........................... 52/219 |
| 5,656,942 A | 8/1997 | Watts et al. |
| 5,804,983 A | 9/1998 | Nakajima et al. |
| 5,949,244 A * | 9/1999 | Miley .......................... 324/762 |
| 5,974,662 A | 11/1999 | Eldridge et al. |
| 6,060,892 A | 5/2000 | Yamagata .................... 324/754 |
| 6,114,869 A | 9/2000 | Williams et al. |
| 6,166,553 A | 12/2000 | Sinsheimer ................. 324/754 |
| 6,271,658 B1 | 8/2001 | Vallinan et al. |
| 6,304,092 B1 | 10/2001 | Jordan ......................... 324/758 |
| 6,433,562 B1 * | 8/2002 | McAllister et al. ......... 324/754 |

FOREIGN PATENT DOCUMENTS

| EP | 0699 913 A2 | 3/1996 |
| JP | 05144892 | 6/1993 |
| WO | WO 96/30772 | 10/1996 |

* cited by examiner

*Primary Examiner*—David P. Bryant
*Assistant Examiner*—Jermie E. Cozart
(74) *Attorney, Agent, or Firm*—Klarquist Sparkman LLP

(57) ABSTRACT

A tooling plate for installation into a probe station and being formed of a rigid plate defining a major aperture having a rim. The plate also defines a set of peripheral apertures fitted with spring loaded, retained screws adapted to facilitate fastening to mating threaded holes. In one embodiment, a set of dowel locator holes defined by the bottom surface and being precisely positioned with respect to the location of the major aperture. Another embodiment includes docking equipment adapted to permit connection to a predetermined tester attached to the top of the rigid plate.

31 Claims, 5 Drawing Sheets

TOOLING PLATE ADAPTED TO FACILITATE RAPID AND PRECISE ATTACHMENT INTO A PROBING STATION

RELATED APPLICATIONS

The present application is a divisional of U.S. patent application Ser. No.: 09/662,735; filing date: Sep. 15, 2000 now U.S. Pat. No. 6,408,500.

BACKGROUND OF THE INVENTION

In the semiconductor field, each set of wafers fabricated is typically performance tested, before they are diced into individual integrated circuits. FIGS. 1–4 show equipment that is used in this testing. Although these figures show an embodiment of the invention they also show some features that are shared with prior art systems. These features are referenced in this section to help explain the context of the invention.

To perform wafer testing a piece of equipment known as a probe station 10 has a head plate 12 that defines an original head plate aperture 14 FIG. 3. The aperture supports a circular device known as a probe card dish 16, which in turn supports the probe card 17. A separate piece of equipment, known as a tester 18 having docking units 20, is lowered into mating position with respect to the probe station, the probe card dish and the probe card. Sometimes probe station 10 includes an obstacle, such as a wafer loader cover 19, that is too close to the original head plate aperture 14 to permit the docking of a particular tester 18.

Generally, a number of guides and associated docking equipment pieces are needed to successfully dock a tester to a probe station, a probe card dish and the wafer that the probe card dish supports. Probe stations are generally sold to semiconductor manufacturing facilities with this docking equipment already installed. Accordingly, when a new tester is purchased it is typically necessary to purchase a new probe station fitted with docking equipment to facilitate docking with the new tester. Unfortunately, the docking equipment, which is typically installed by the probe station vendor or a secondary source, generally permits docking to a single make of tester. The installation of docking equipment to permit the use of a different tester with the probe station is referred to in the industry as "hardware swap-out" and results in extensive use of technician time and equipment down time.

It is known to machine a single prober to accept a single tooling plate that permits docking to a desired tester. There appears, however, not to have been an effort in the prior art to produce a set of standardized tooling plates that could each be used on any one of a set of differing probe stations. As a result, only very limited flexibility was gained by this method.

Another issue facing semiconductor manufacturers is the lack of uniformity of head plate apertures, between the various commercial lines of probe stations. The unfortunate result is that there is currently no known technique for mating a probe station having a first head plate aperture size with a tester designed to mate with a prober having a second head plate aperture size.

SUMMARY OF THE INVENTION

In a first separate aspect, the present invention is a tooling plate for installation into a probe station. The plate comprises a rigid plate defining a major aperture and a set of peripheral apertures fitted with spring loaded, retained screws adapted to facilitate fastening to mating threaded holes.

In a second separate aspect, the present invention is a tooling plate for installation into a probe station, the plate comprising a rigid plate defining a major aperture and a set of dowel locater holes precisely set with respect to the location of the major aperture.

In a third separate aspect, the present invention is a tooling plate for installation into a probe station, said tooling plate comprising a rigid plate having a top and a bottom and defining a major aperture having a rim, and having docking equipment adapted to permit connection to a predetermined tester attached to said top of said rigid plate.

In a fourth separate aspect, the present invention is a tooling plate for installation into a probe station, said tooling plate comprising a rigid plate defining a major aperture having a rim adapted to retain a probe card dish and a set of bosses protruding slightly upwardly along said rim, each boss fitted with a threaded hole, to facilitate the attachment of said probe card dish.

The foregoing and other objectives, features and advantages of the invention will be more readily understood upon consideration of the following detailed description of the preferred embodiment(s), taken in conjunction with the accompanying drawings.

DETAILED DESCRIPTION OF THE PREFERRED EMBODIMENTS

Figure 3:
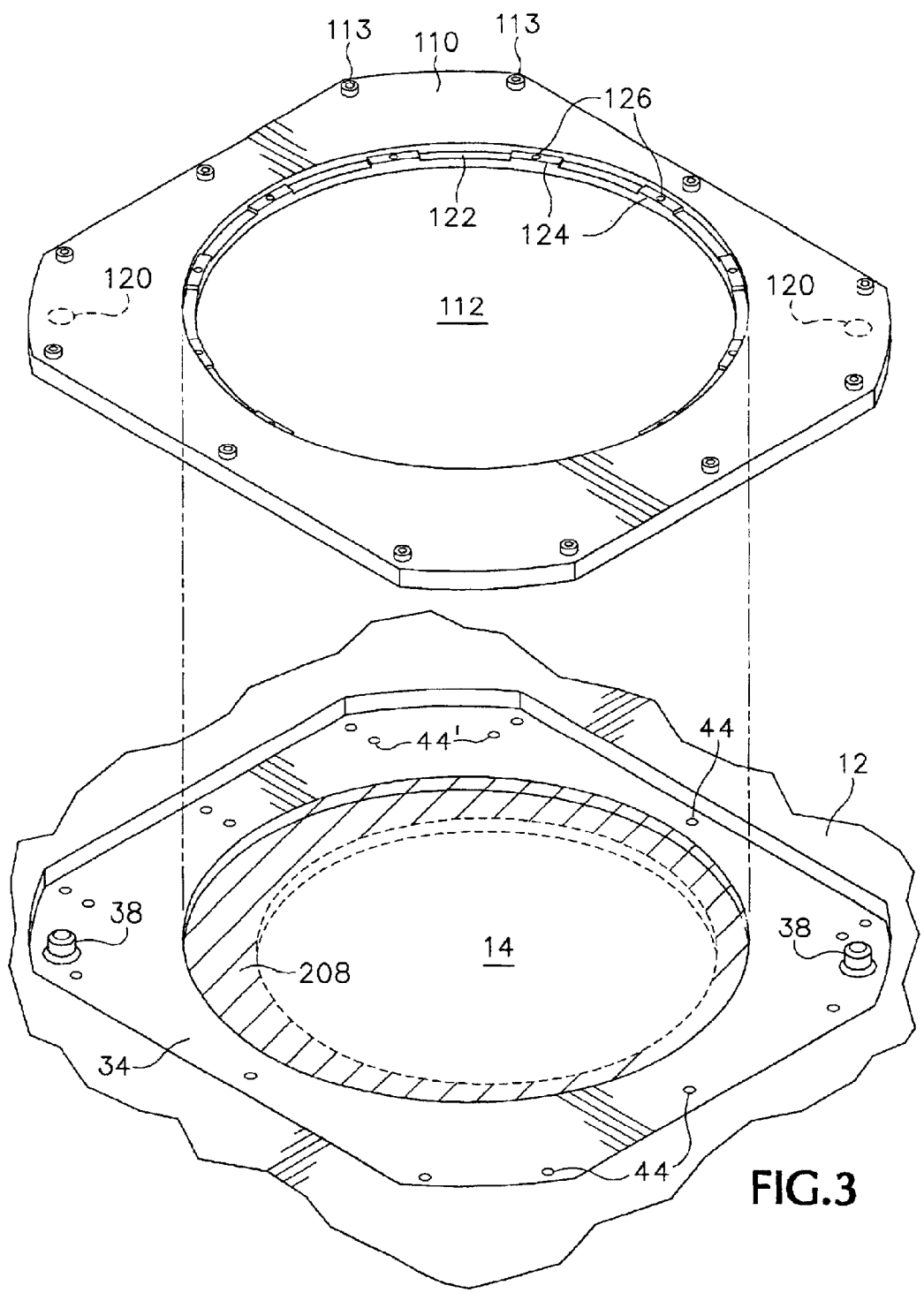
FIG. 3 is an exploded perspective view of a portion of the probe station of FIG. 1, showing some of the details of the retrofitting of the present invention.

To perform one preferred method of retrofitting a probe station according to the present invention, 0.3 mm (12 mils) of material is machined away from the top of the head plate 12 of the probe station 10 (both items have been introduced in the Background section) to form a head plate-tooling plate attachment region 34 (FIG. 3). A pair of through-holes (not shown) is drilled through the attachment region 34 of the head plate 12 to permit the attachment of a pair of dowel pins 38.

Figure 1:
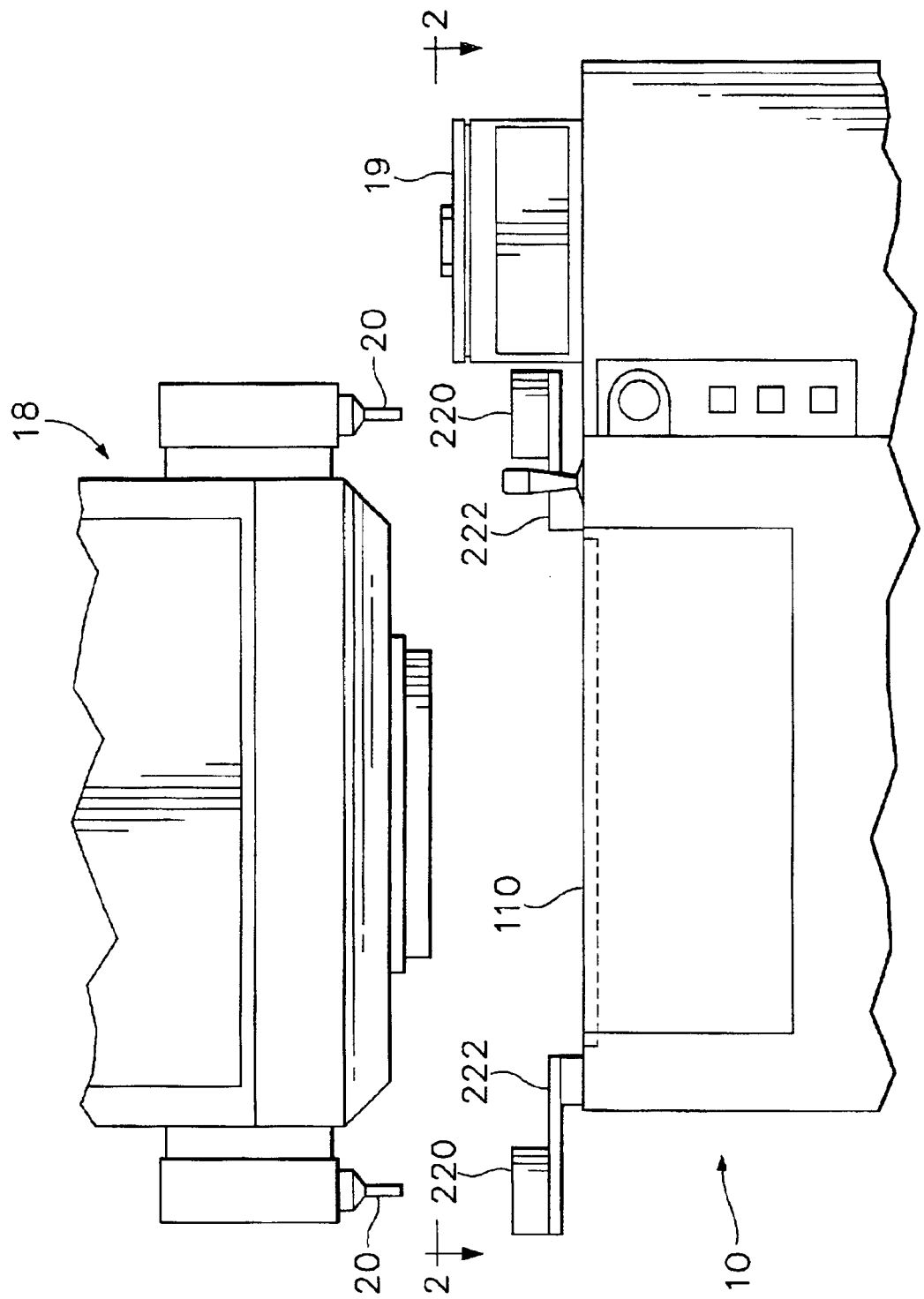
FIG. 1 is a side view of a probe station-tester mating pair wherein the probe station has been retrofitted according to the method of the present invention.
Figure 2:
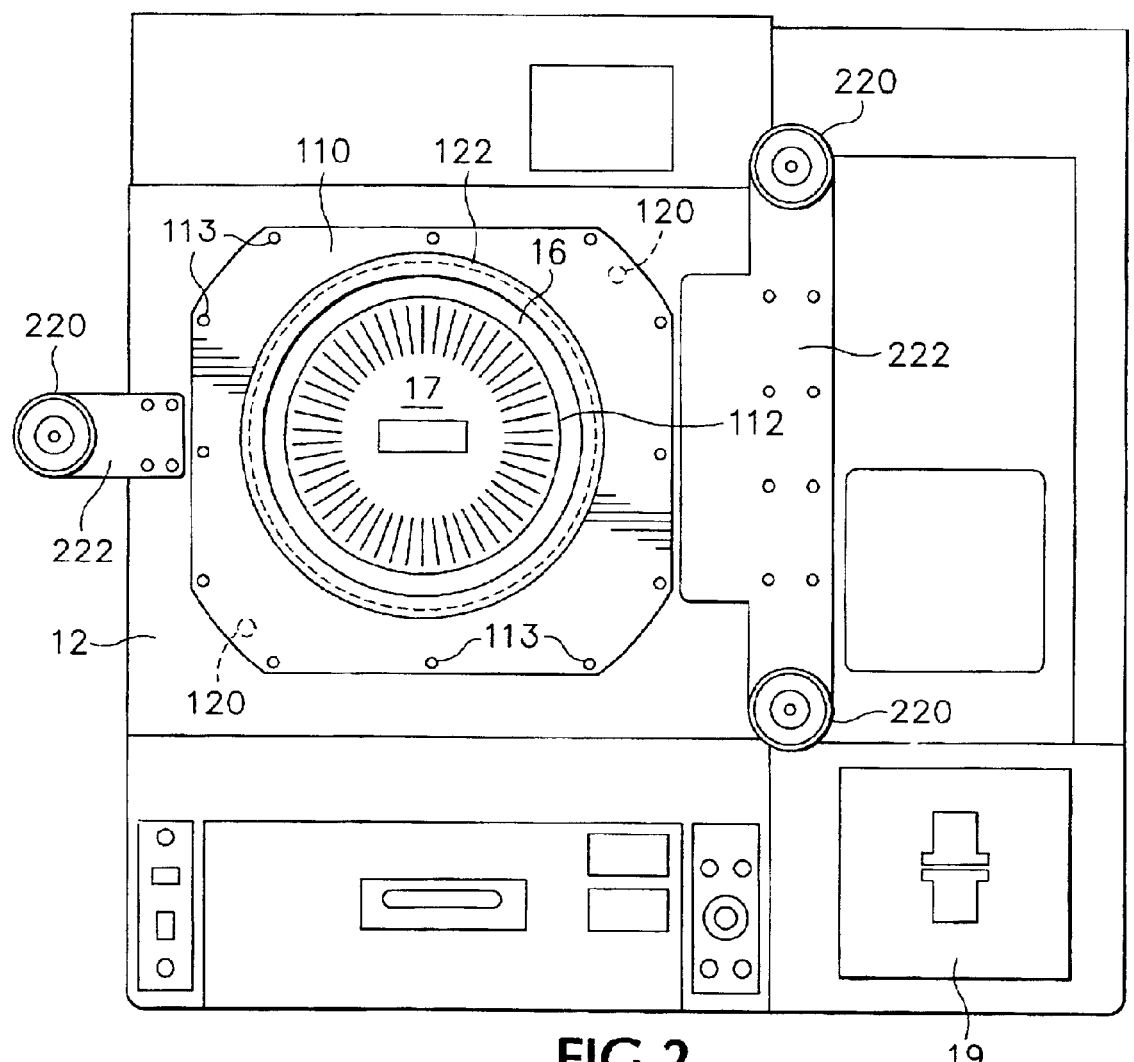
FIG. 2 is a top view of the probe station of FIG. 1.

In addition a sequence of threaded holes 44 are machined just inside the periphery of attachment region 34. The method of retrofitting a probe station that is the subject of the present invention is accomplished with the use of a tooling plate 110 as shown in FIGS. 1 and 2. Spring-loaded screws are set into a set of apertures 113, to permit the rapid attachment of plate 110 to a retrofitted probe station. The bottom side of plate 110 defines dowel pin locator holes 120, which are configured to mate with dowel pins 38 and thereby facilitate the precise positioning of plate 110. In one preferred embodiment the dowel pins 38 are sited with great precision relative to the center of aperture 14 to ensure correct alignment and positioning of a tooling plate 110.

Figure 4:
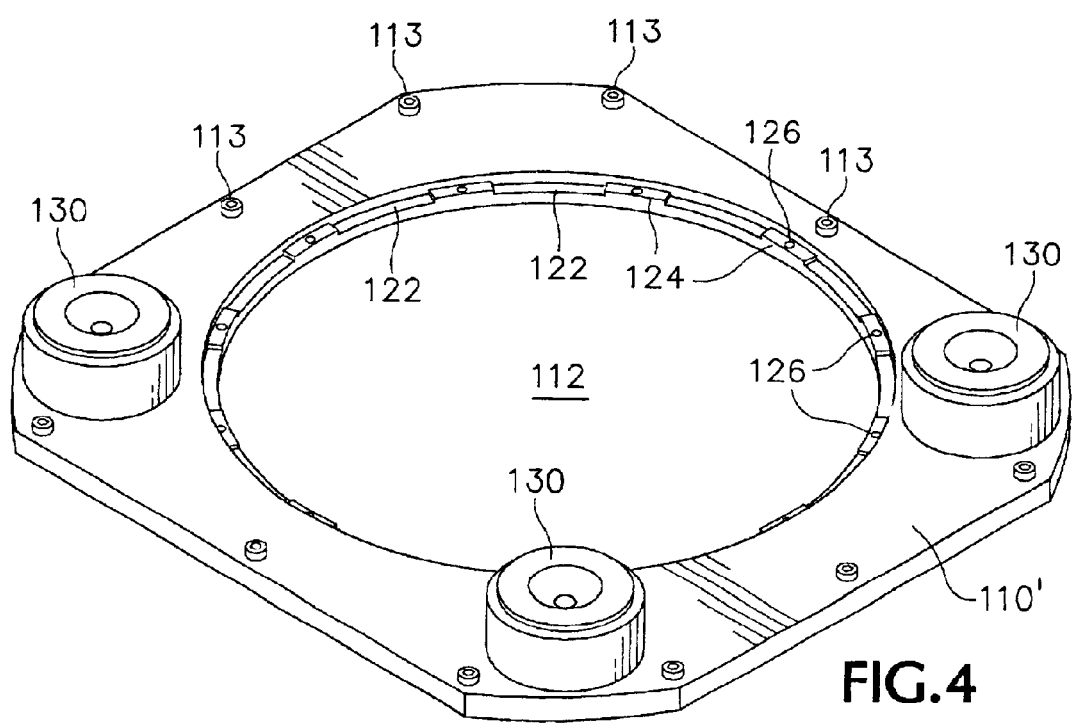
FIG. 4 is a perspective view of a tooling plate and docking equipment attached to the tooling plate.

The tooling plate 110, defines a tooling plate major aperture 112 for supporting a probe card dish. A rim 122, adapted for probe card dish attachment is defined about aperture 112. A set of bosses 124, each sunk with a threaded hole 126, ease the attachment of the probe card dish. Referring to FIG. 4, in some instances a set of docking equipment 130 is included as a part of an alternative tooling plate 110' so that the installation of plate 110' renders the probe station 10 ready to dock with a tester of choice 18.

Ideally, a number of tooling plates 110' could be provided, each one fitted with a distinct set of docking equipment 130 adapted to dock with a particular tester. In this manner, a semiconductor manufacturing facility that owns a number of testers and a number of probe stations could dock any one of a number of testers with any one of a number of probe stations. Moreover, if more than one probe station was retrofitted to accept any one out of a number of tooling plates 110', than any one of these testers could be placed in service with any probe station for which a matable plate 110' was available.

It should be expressly noted that by producing a set of tooling plates, each of which has a standardized set of location and attachment items, and by modifying a set of probe stations so that each one has a standardized set of location and attachment items designed to mate to the tooling plate location and attachment items, that a great flexibility can be achieved in the sense that any of the probe stations can be mated to any of the tooling plates and thereby to any tester for which such a tooling plate is available. This technique appears to be unknown in the prior art and can be applied even to probe stations of differing makes, such as the popular brands TSK®, TEL® and EG®.

In an alternative preferred embodiment, no depression is machined in head plate 12. Dowell pins 38 and threaded holes 44 are provided on the top surface of head plate 12 and a tooling plate 110 is attached on top of head plate 12.

In one preferred embodiment a second set of threaded holes 44' is provided in head plate attachment region 34 for the attachment of a smaller tooling plate 110. Such a smaller tooling plate 110 would typically be made to fit a probe station 10 having a smaller head plate. By providing the second set of threaded holes 44' a probe station 10 is made available for retrofitting with tooling plates 110 made primarily for a different line of probe stations 10 having smaller head plates 12.

Figure 5:
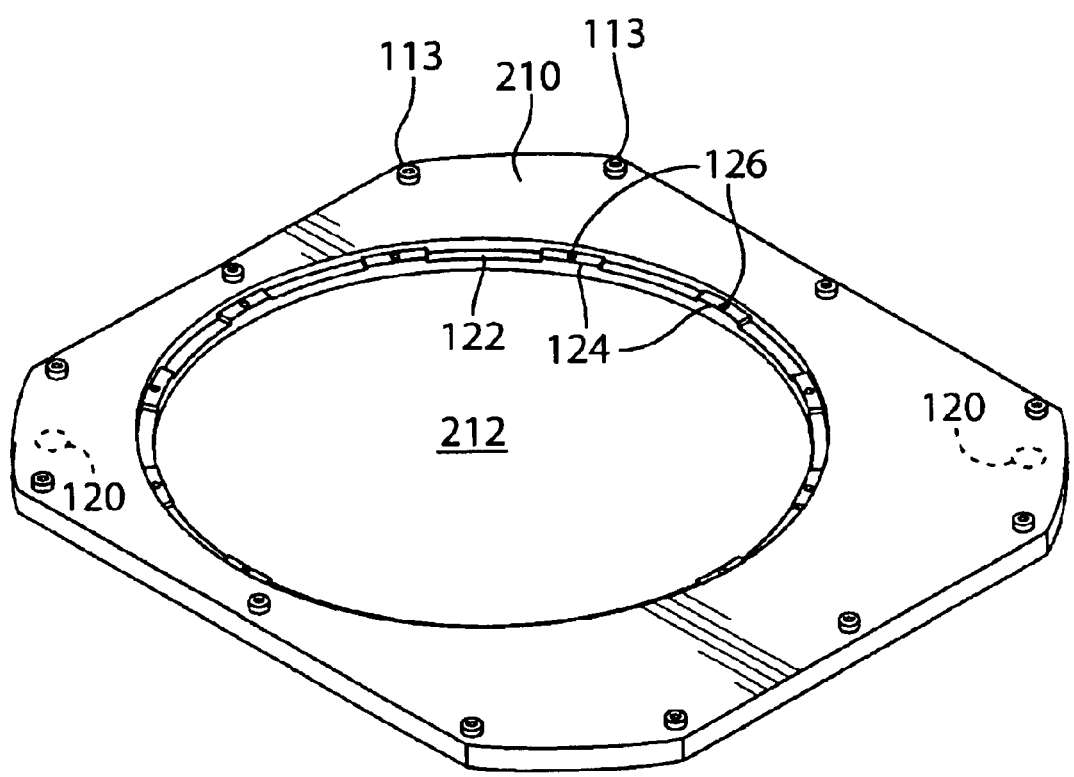
FIG. 5 is a perspective view of another embodiment of a tooling plate.

Referring again to FIGS. 1–2, in some instances, a probe station will have a head plate that is fairly small and will, further, have an obstacle 19 such as the cover for the device that loads the wafers onto the probe card dish (the "loader cover"). It may not be possible to dock this type of probe station to a tester without moving the probe card dish location away from the obstacle. To do this, the original head plate aperture 14 is enlarged by region 208 (FIG. 3), and a tooling plate 210 (FIG. 5) is provided having a major aperture 212 (FIG. 5) that is not centered with respect to the remainder of the tooling plate 210. When tooling plate 210 is installed the major aperture 212 is located differently from the original head plate major aperture 14 and is further away from the obstacle, thereby permitting a tester of choice to dock to tooling plate 210 without encountering the obstacle.

In this embodiment the docking equipment 220 is included on a set of docking equipment plates 222. To facilitate the correct attachment of plates 222 to head plate 12, head plate 12 is machined in similar manner to the machining of attachment region 34 but nearer to its edge to form docking equipment plate attachment regions (not shown) which would include location and attachment items such as threaded holes and dowel pins.

It should be noted that to successfully implement the embodiment shown in FIGS. 1 and 2, that the software that drives the tester and probe station must be adjusted to account for the difference in location between the tooling plate major aperture 212 and head plate original major aperture 14.

The terms and expressions which have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A tooling plate for installation into a probe station, said tooling plate comprising a rigid plate defining a major aperture having a rim dimensioned to support a peripheral outer edge of a probe card dish, and a set of peripheral apertures fitted with spring loaded, retained screws adapted to facilitate fastening to mating threaded holes, wherein the tooling plate is configured to be mounted to a head plate of the probe station.

2. A tooling plate for installation into a probe station, said tooling plate comprising a rigid plate having a top and bottom surfaces and defining a major aperture having a rim, and a set of dowel locator holes defined by said bottom surface and being precisely positioned with respect to the location of the major aperture, wherein the locator holes are adapted to receive dowel pins extending from a head plate on the probe station such that when the tooling plate is mounted on the head plate, a probe card supported by the rim can electrically contact a semiconductor wafer in the probe station.

3. A tooling plate for installation into a probe station, said tooling plate comprising a rigid plate having a top and bottom and defining a major aperture having a rim dimensioned to support a probe card dish that supports a probe card, and having docking equipment adapted to permit connection to a predetermined tester attached to said top of said rigid plate, wherein the tooling plate is configured to be mountable to a head plate of the probe station such that the probe card can establish an electrical connection between the tester and a semiconductor wafer in the probe station.

4. The tooling plate of claim 3, further comprising a plurality of peripheral apertures fitted with spring loaded screws adapted to be received in mating threaded holes in the probe station.

5. The tooling plate of claim 3, further comprising a set of dowel locator holes in the bottom of the tooling plate to facilitate alignment of the tooling plate on the probe station.

6. The tooling plate of claim 3, wherein the docking equipment comprises at least one docking equipment plate mounted to the top of the tooling plate and at least one piece of docking equipment mounted on the docking equipment plate.

7. The tooling plate of claim 3, wherein the tooling plate is configured to be installed on a plurality of probe stations to permit docking of the predetermined tester to any of the plurality of probe stations.

8. A set of tooling plates for installation on the probe station comprising the tooling plate of claim 3 and at least one additional tooling plate comprising a rigid plate having a top and bottom and defining a major aperture having a rim, the additional tooling plate having docking equipment adapted to permit connection to a predetermined tester, each tooling plate being removably mountable to the probe station to permit docking of a respective predetermined tester to the probe station.

9. A set of tooling plates for installation on a plurality of probe stations comprising the tooling plate of claim 3 and at least one additional tooling plate comprising a rigid plate having a top and bottom and defining a major aperture having a rim, the additional tooling plate having docking equipment attached to the top thereof, each tooling plate being removably mountable to each of the plurality of probe stations so that each tooling plate can be used to dock a respective predetermined tester to any of the plurality of probe stations.

10. The tooling plate of claim 3, wherein the major aperture of the tooling plate is offset from the center of the tooling plate such that when the tooling plate is installed on the head plate, the tooling plate major aperture is offset from a major aperture of the head plate.

11. A tooling plate for installation into a probe station, said tooling plate comprising a rigid plate defining a major aperture having a rim adapted to retain a probe card dish and a set of bosses protruding slightly upwardly along said rim, each boss fitted with a threaded hole, to facilitate the attachment of said probe card dish, the tooling plate also comprising a plurality of alignment items adapted to mate with corresponding alignment items on a head plate of the probe station to facilitate alignment of the tooling plate on the head plate.

12. A tooling plate for installation into a probe station, said tooling plate comprising:
  a rigid plate having a top and bottom and defining a major aperture having a rim, and having docking equipment adapted to permit connection to a predetermined tester attached to said top of said rigid plate; and
  a set of bosses protruding slightly upwardly along said rim, each boss having a threaded hole adapted to receive a fastener for attaching a probe card dish to the rim.

13. A tooling plate for installation into a probe station, said tooling plate comprising a rigid plate having a top and bottom and defining a major aperture having a rim, and having docking equipment adapted to permit connection to a predetermined tester attached to said top of said rigid plate;
  wherein the docking equipment comprises at least one docking equipment plate mounted to the top of the tooling plate and at least one piece of docking equipment mounted on the docking equipment plate;
  wherein the at least one docking equipment plate has a first portion mounted to the tooling plate and a second portion that is cantilevered from the first portion, the at least one piece of docking equipment being mounted to the second portion.

14. The tooling plate of claim 13, wherein the at least one docking equipment plate is an elongate member and the first and second portions are first and second end portions, respectively, of the elongate member.

15. A set of tooling plates for installation on the probe station comprising a tooling plate for installation into a probe station, said tooling plate comprising a rigid plate having a top and bottom and defining a major aperture having a rim, and having docking equipment adapted to permit connection to a predetermined tester attached to said top of said rigid plate, and at least one additional tooling plate comprising a rigid plate having a top and bottom and defining a major aperture having a rim, the additional tooling plate having docking equipment adapted to permit connection to a predetermined tester, each tooling plate being removably mountable to the probe station to permit docking of a respective predetermined tester to the probe station;
  wherein the tooling plates have different docking equipment to permit docking of different testers to the probe station.

16. An apparatus for installation on the head plate of a probe station used in testing semiconductor devices, the apparatus comprising:
  a removable tooling plate configured to be connectable to and completely disconnectable from the head plate of the probe station, the tooling plate having upper and lower opposed major surfaces, the tooling plate having at least one alignment item adapted to mate with a corresponding alignment item on the head plate to facilitate alignment of the tooling plate on the head plate; and
  docking equipment mounted to the upper surface, the docking equipment configured to facilitate docking of a tester to the probe station.

17. The apparatus of claim 16, wherein the tooling plate is formed with a major aperture dimensioned to receive a probe card dish.

18. The apparatus of claim 16, wherein the docking equipment comprises at least one docking equipment plate mounted to the upper major surface and at least one piece of docking equipment mounted on the docking equipment plate.

19. The apparatus of claim 16, wherein the tooling plate comprises a major aperture and a rim portion circumscribing the aperture for supporting a probe card dish positioned in the aperture.

20. The apparatus of claim 16, wherein the tooling plate comprises at least one fastening item for releasably mounting the tooling plate to the head plate of the probe station.

21. The apparatus of claim 20, wherein the at least one fastening item comprises at least one spring-loaded screw for tightening into a respective hole in the head plate.

22. The apparatus of claim 16, wherein the at least one alignment item comprises at least one alignment hole adapted to receive an alignment pin on the head plate.

23. An apparatus for installation on the head plate of a probe station used in testing semiconductor devices, the apparatus comprising:
  a removable tooling plate configured to be connectable to and completely disconnectable from the head plate of the probe station, the tooling plate having upper and lower opposed major surfaces, the tooling plate having at least one alignment item adapted to mate with a corresponding alignment item on the head plate to facilitate alignment of the tooling plate on the head plate; and
  docking equipment mounted to the upper surface, the docking equipment configured to facilitate docking of a tester to the probe station;
  wherein the tooling plate comprises a major aperture and a rim portion circumscribing the aperture for supporting a probe card dish positioned in the aperture;
  wherein the rim portion comprises a plurality of circumferentially spaced bosses, each formed with a hole for receiving a fastener for coupling the probe card dish to the rim portion.

24. A set of tooling plates for installation on a probe station having a head plate, comprising:
  a first tooling plate having a footprint that is smaller than the footprint of the head plate, the first tooling plate being adapted to be removably mounted to the head plate of the probe station and having first docking equipment adapted to permit docking of a first tester out of a set of testers; and
  a second tooling plate having a footprint that is smaller than the footprint of the head plate, the second tooling plate being adapted to be removably mounted to the head plate of the probe station and having second docking equipment adapted to permit docking of a second tester out of a set of testers.

25. The set of tooling plates of claim 24, wherein each tooling plate has a major aperture dimensioned to receive a probe card dish.

26. The set of tooling plates of claim 24, wherein each tooling plate has plural alignment items that mate with corresponding alignment items on the probe station to facilitate alignment of the tooling plate on the probe station.

27. The set of tooling plates of claim 26, wherein the alignment items of the tooling plates comprise holes and the alignment items of the probe station comprise alignment pins.

28. A set of tooling plates for installation on a probe station, comprising:
- a first tooling plate adapted to be removably mounted to the probe station and having first docking equipment adapted to permit docking of a first tester out of a set of testers; and
- a second tooling plate adapted to be removably mounted to the probe station and having second docking equipment adapted to permit docking of a second tester out of a set of testers;
- wherein the first docking equipment is different than the second docking equipment.

29. A set of tooling plates for installation on a plurality of probe stations of differing makes having respective head plates, comprising:
- a first tooling plate adapted to be removably mounted to the head plate of each of the plurality of probe stations and having first docking equipment, wherein when the first tooling plate is mounted to one of said plurality of probe stations, the first docking equipment permit docking of a first tester to the probe station; and
- a second tooling plate adapted to be removably mounted to the head plate of each of the plurality of probe stations and having second docking equipment, wherein when the second tooling plate is mounted to one of said plurality of probe stations, the second docking equipment permit docking of a second tester to the probe station.

30. The set of tooling plates of claim 29, wherein each tooling plate has a major aperture dimensioned to receive a probe card dish.

31. A set of tooling plates for installation on a plurality of probe stations, comprising:
- a first tooling plate adapted to be removably mounted to each of the plurality of probe stations and having first docking equipment, wherein when the first tooling plate is mounted to one of said plurality of probe stations, the first docking equipment permit docking of a first tester to the probe station; and
- a second tooling plate adapted to be removably mounted to each of the plurality of probe stations and having second docking equipment, wherein when the second tooling plate is mounted to one of said plurality of probe stations, the second docking equipment permit docking of a second tester to the probe station;
- wherein the first tester is different than the second tester.

* * * * *